US007348865B2

(12) United States Patent
Carvalho et al.

(10) Patent No.: US 7,348,865 B2
(45) Date of Patent: Mar. 25, 2008

(54) IMPEDANCE-MATCHING COUPLER

(75) Inventors: Maria Carvalho, Rio de Janeiro (BR); Luiz Conrado, Rio de Janeiro (BR); Luciene Demenicis, Rio de Janeiro (BR); Walter Margulis, Huddinge (SE); Daniele Seixas, Niterói (BR)

(73) Assignee: Ericsson Telecommunicacoes S.A., Sao Paulo SP (BR)

( * ) Notice: Subject to any disclaimer, the term of this patent is extended or adjusted under 35 U.S.C. 154(b) by 148 days.

(21) Appl. No.: 10/548,267

(22) PCT Filed: Mar. 7, 2003

(86) PCT No.: PCT/BR03/00031

§ 371 (c)(1), (2), (4) Date: Nov. 15, 2005

(87) PCT Pub. No.: WO2004/079855

PCT Pub. Date: Sep. 16, 2004

(65) Prior Publication Data

US 2006/0226930 A1 Oct. 12, 2006

(51) Int. Cl.
*H03H 7/38* (2006.01)

(52) U.S. Cl. ........................................ 333/33; 333/238

(58) Field of Classification Search .................. 333/33, 333/34, 238, 246
See application file for complete search history.

(56) References Cited

U.S. PATENT DOCUMENTS 3,419,813 A 12/1968 Kamnitsis
3,449,813 A 6/1969 Tregubenko
5,119,048 A 6/1992 Grunwell
5,140,288 A 8/1992 Grunwell
5,200,719 A 4/1993 Margulis et al.
2003/0214364 A1* 11/2003 Cites et al. .................. 333/33

OTHER PUBLICATIONS

International Search Report of PCT/BR03/00031, mailed Sep. 25, 2003.

Vegni et al, "Tapered stripline embedded in inhomogeneous media as microwave matching line", IEEE Transactions on Microwave Theory and Techniques, May 2001, vol. 49, No. 5, pp. 970-978, XP002253713.

Urbani et al., "Inhomogeneous layered planar structures: an analysis of reflection coefficient", 11th International Conference on Computation of Electromagnetic Fields (Compumag), Nov. 1997, vol. 34, No. 5, Pt. 1, pp. 2771-2774, XP002253714.

M. Carvalho et al, "A New, Small-Sized Transmission Line Impedance Transformer, with Applications in High-Speed Optoelectronics" *IEEE Microwave and Guided Wave Letters*, vol. 2, No. 11, Nov. 1992.

* cited by examiner

*Primary Examiner*—Stephen E. Jones
(74) *Attorney, Agent, or Firm*—Nixon & Vanderhye P.C.

(57) ABSTRACT

An impedance-matching coupler (1) comprises a dielectric substrate (10) onto which a conducting strip (12) is disposed. A dielectric layer (14), preferably a dielectric film, is formed on top of the conducting strip and the first dielectric layer to encircle the conducting strip. A metallic layer (16, 18) is finally provided on top of the dielectric layer. The dielectric layer has a dielectric constant that is substantially higher that the dielectric constant for the dielectric substrate, preferably more than ten times higher. A dielectric film with a thickness of less than 100 μm is advantageous, preferably between 5 and 100 μm, and even more preferably between 10 and 70 μm. The thickness of the dielectric substrate is preferably larger than for the dielectric film, preferably more than ten time larger. The conducting strip has preferably a constant width. The dielectric film thickness is preferably larger than 10% of the conducting strip width.

17 Claims, 4 Drawing Sheets

IMPEDANCE-MATCHING COUPLER

This application is the U.S. national phase of international application PCT/BR2003/000031 filed 7 Mar. 2003 which designated the U.S., the entire content of which is hereby incorporated by reference.

TECHNICAL FIELD

The present invention relates generally to impedance-matching devices.

BACKGROUND

In numerous technical applications, there is a need for coupling electrical signals to and from high-speed electronic devices. One particular application is the coupling of electrical signals to semiconductor laser diodes driven by high frequency signals or very short pulses. These devices have low impedance and in order to reduce reflection problems, an impedance matching to e.g. a 50Ω external cable has to be provided. High-speed photodiodes present a similar problem. In order to improve the efficiency and temporal response performance it is necessary to match the relatively high impedance of the photodiode with a low external load e.g. by use of wide-band impedance transformers.

Some solutions for matching different impedance values are present in prior art. In most cases in microwave technology, a narrow band resonant structure is constructed, for instance with stubs of given length. Common to most broadband solutions is that the impedance-matching device tries to create a gradual impedance change between the ends of the impedance matching device. The gradual change is achieved by e.g. varying the transmission line dimensions, the thickness of any dielectric material between the transmission line and grounded parts of the device, the geometry of grounded parts or the dielectric constant of the dielectric material.

However, complex additional requirements or limitations are present. In many recent applications, the device is requested to match impedances typically between 50Ω and 3Ω, and in some cases even from 377Ω down to around 3Ω. Furthermore, if short pulses are used, the impedance matching has to be operable within a large bandwidth. The size of the device is also of crucial interest, since many of the devices connected to it are small. In the case of e.g. laser diodes, the total size should preferably not be larger than about 1-2-cm.

Furthermore, additional effects, such as dispersion, higher order modes and energy loss have to be considered carefully. Finally, such impedance-matching devices also have to be easy and inexpensive to manufacture. The requirements discussed above make the design of well operating impedance-matching devices very difficult indeed. A number of proposals are presented in prior art, each one with pertinent drawbacks.

The problems affecting impedance matching structures known from the prior art can be illustrated with the transmission line transformer (TLT), proposed in U.S. Pat. No. 5,200,719. The structure was designed to match the input resistance of laser diodes to 50 ohms and of photodiodes to low impedances (~3Ω), allowing considerable improvement of the efficiency and temporal response of the semiconductor devices. The impedance-matching coupling device comprises a dielectric slab of uniform thickness, supporting on the upper face a coplanar transmission line formed by a conducting strip centrally located, alongside which two ground planes are placed. The characteristic impedance of the device undergoes a gradual change of value through a gradual variation of the spacing between lateral and central conductors, as well as through a change of the width of the conductors. The lower surface of the slab supports another conducting ground plane and all ground plane conductors are electrically joined at both ends of the device, as well as on several intermediate points, by shorting straps or wires. By using very high dielectric constant bulk substrates, the size of the TLT can be greatly reduced. However, simulations have shown that the resulting transversal physical dimension requirements limited the transformation impedance level from 50Ω to no less than 8Ω. In this TLT arrangement, the gap to the grounded semiplanes on either side of the line varied from 1.07 mm to 10 μm. Even with this extremely narrow gap, the impedance is not lower than 8Ω at the low impedance side. The fabrication of such an impedance matcher with very small features is very difficult. An additional disadvantage of the TLT described in U.S. Pat. No. 5,200,719 is that it is difficult to obtain substrate materials with low loss at microwave frequencies and very high relative dielectric constant. Yet another disadvantage of the structure is that high dielectric constant bulk substrates introduce large dispersion, which causes problems such as ringing. Furthermore, it has been observed that this structure does not respond above 25 GHz due to the appearance of higher order modes.

Another solution to the problem of matching the impedance of two transmission lines is disclosed in the U.S. Pat. No. 5,119,048. The impedance matching network comprises of two layers of dielectric substrates. A central conductor is disposed between the two layers. Ground planes are located on the surfaces of the substrates that are opposite to the side of the central line and the width of the ground plane metallization along the structure is varied by forming tapered conducting shapes.

One problem with the solution in U.S. Pat. No. 5,119,048 is that there are difficulties in avoiding an air gap between the two dielectric substrates. Therefore, soft substrates are typically used for stripline-like structure in order to facilitate the contacting between the dielectrics. Such soft substrates generally have a relatively low dielectric constant. This in turn leads to impedance-matching devices with a large geometrical extension. This solution also has the drawback of giving rise to large transversal dimensions to match impedances in the range of interest. A typical embodiment according to U.S. Pat. No. 5,119,048 matches impedances of 27 and 50Ω, respectively, in the frequency range between 350 MHz and 1.5 GHz. In many recent applications, this is totally insufficient. The limitation of the useful frequency and impedance range is due to dispersion effects arising in the bulk substrates, low dielectric constant values and size constraints.

In U.S. Pat. No. 5,140,288, another impedance-matching device is disclosed. The device includes a dielectric having a varying thickness between opposing surfaces. The impedance transformation between the two terminals is proportional to the thickness variation of the dielectric.

Besides similar drawbacks as for the earlier discussed solution, this latter device is not very adapted to manufacturing demands. The variation in dielectric thickness is not easy to accomplish for harder dielectric materials. Furthermore, also in this type of devices, severe dispersion exists at higher frequencies. Moreover, at the narrow end of the wedge-formed dielectric part, the lateral extension of the parallel line and ground planes are large compared with the width of the dielectric part, which may induce problems with higher order modes of the created electromagnetic field.

In U.S. Pat. No. 3,419,813, an impedance-matching device is disclosed, which comprises a tapered conductor separated from a ground plane by a dielectric slab. A tapered line section which has an impedance of, for instance, 5 ohms at its low impedance stripline end, requires a greatest width of 7 mm and a total length greater than 5 cm when a PTFE substrate slab of $\epsilon_r$=10 and a thickness of 0.635 nm is used. Such dimensions are incompatible with the small dimensions of the packages of the optoelectronic devices.

Therefore, general problems with prior art impedance-matching devices are that the operational bandwidth is limited, high order modes appear at low frequencies, the dispersion causes the device to respond differently at various frequencies, the fabrication is difficult and expensive because of the required tolerance, or the size is too large for accommodation within the package.

SUMMARY

A general object of the present invention is to provide impedance-matching devices having improved operational bandwidths and low dispersion. A further object of the present invention is to provide impedance-matching devices with small geometrical sizes. Another object of the present invention is to provide suitable and efficient manufacturing methods for such impedance-matching devices.

The above objects are achieved by impedance-matching devices and manufacturing methods according to the attached patent claims. In general, an impedance-matching coupler according to the present invention comprises a dielectric substrate onto which a conducting strip is disposed. A dielectric layer, preferably a dielectric film, is formed on top of the conducting strip and the first dielectric layer to encircle the conducting strip. An electrically grounded metallic layer is finally provided on top of the dielectric layer. The dielectric layer is according to a preferred embodiment of the manufacturing method according to the present invention formed by film depositing techniques directly on the dielectric substrate. The dielectric layer has a dielectric constant that is substantially higher that the dielectric constant for the dielectric substrate, preferably more than about eight times higher.

The dielectric layer is as indicated above preferably very thin, preferably a film with a thickness of less than 100 μm. Due to requirements of manufacturing accuracy, the film thickness is preferably between 5 and 100 μm, and even more preferably between 10 and 70 μm. The thickness of the dielectric substrate is preferably larger than for the dielectric film, preferably more than ten times larger.

The conducting strip has preferably a constant width, preferably in the order of magnitude of 120 μm or wider. The dielectric film thickness is preferably larger than 10% of the conducting strip width. The electrically grounded metallic layer has preferably a central slot parallel to the conducting strip, which slot has a tapered shape. The minimum width of the slot is preferably in the same size range as the width of the conducting strip.

The present invention has a number of advantages. By using a film of dielectric constant much higher than the substrate, the electromagnetic field does not penetrate the substrate as it penetrates the film. Consequently, the impedance and dispersion characteristics are primarily determined by the transmission line made across the film. Also, the relatively small thickness of the film allows the impedance to reach very low values (<5Ω) with convenient fabrication thereof. First, the film depositing opens up for the use of very high dielectric constant materials ($\epsilon_r$=80 or higher). The devices according to the present invention are possibly to manufacture with small geometrical dimension. Furthermore, due to the use of films, dispersion is reduced and by the preferred geometrical configuration, single-mode operation is assured. The devices thus present large bandwidths and low pulse deformation. The devices are also comparably cheap to manufacture.

BRIEF DESCRIPTION OF THE DRAWINGS

The invention, together with further objects and advantages thereof, may best be understood by making reference to the following description taken together with the accompanying drawings, in which.

DETAILED DESCRIPTION

For high dielectric constant materials, e.g. ferroelectric ceramics, such as $SrTiO_3$, $Ba_xSr_{1-x}TiO_3$, or $KTaO_3$, the wavelength at a particular frequency is significantly reduced as compared with materials with low dielectric constants. Since a well-operating impedance-matching device typically has a large size compared to a typical wavelength for the used frequencies, this is an opening for construction of smaller devices without increasing the reflection coefficient at higher frequencies. The use of high dielectric constant materials in impedance-matching devices therefore enables compatibility between the dimensions of the impedance transformer and those of for example packaged laser diodes.

Figure 1:
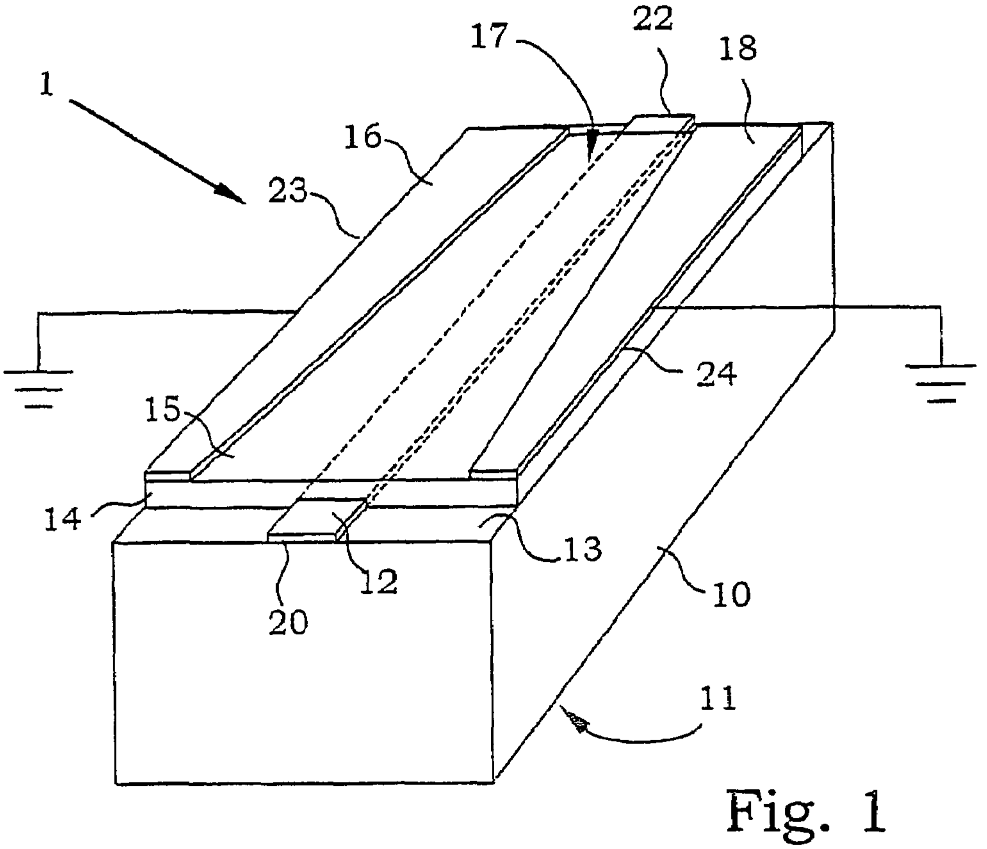
FIG. 1 is a perspective view of an embodiment of an impedance-matching coupler according to the present invention.

The possibility of using materials with high dielectric constant in impedance-matching devices is increased by recent developments in deposition of thin and thick films of high dielectric constant materials, see e.g. Spartak S. Gevorgian and Erik Ludvig Kollberg, "Do We Really Need Ferroelectrics in Paraelectric Phase Only in Electrically Controlled Microwave Devices?", IEEE Transactions on Microwave Theory and Techniques, Vol. 49, No. 11, November 2001. FIG. 1 illustrates an embodiment of an impedance-matching coupler 1 according to the present invention. A transmission line is fabricated on top of a substrate 10. The transmission line comprises a center strip 12, a dielectric layer 14 provided on top of the center strip 12, and an electrically grounded layer 16, 18 on top of the dielectric layer 14. The center strip 12 of conducting material, i.e. a conducting strip, has in the present embodiment a constant width and it is printed on an upper surface 13 of the dielectric substrate 10, in this embodiment a bulk ceramic substrate. (The references to "upper", "lower", "top" and "bottom" are only to facilitate the description in connection with the figure and should not limit the scope of the invention.) The center strip 12 extends between a first end 20 and a second end 22, being the connection points to the components, the impedance of which should be matched. Since the conducting strip 12 is to be connected to associated electronics components, the width of the strip is preferably in range compatible with typical connector arrangements. The smallest used standard connection is adapted to the width 120 μm, and the conducting strip 12 has therefore preferably a width in the same order of magnitude. The thickness of the conducting strip 12 is of the order of 1 μm, and should be sufficiently large to guarantee excellent contact even at high frequencies.

The dielectric substrate 10 does not need to have any metallization on the other, lower, side 11. In other words, the bottom surface of the substrate 10 may very well be in contact with substantially non-conducting or semi-conducting matter, such as insulators, semiconductors or fluids of different non-conducting kinds. However, a metallization is not excluded, but will have a small influence of the impedance properties of the device. The thickness of dielectric layer forming the substrate 10 is typically in the order of 0.2 to 1 mm. Typical examples of substrate materials are alumina or glass. The dielectric constant for these materials is typically in the range of 5-10. With respect to the preferred manufacturing method, described further below, the dielectric substrate 10 should preferably manage to be heated to 600-1000° C. without degrading in properties or shape.

A dielectric layer, in this embodiment a dielectric film 14, with a very high dielectric constant is formed over the transmission line 12, also covering at least a part of the dielectric substrate 10. The formation directly at the substrate 10 ensures a good adherence to the transmission line 12 as well as to the substrate 10, avoiding air gaps between the different parts. The substrate 10 and the dielectric film 14 will thus together encircle the transmission line 12 in a cross-sectional view. The dielectric material in the film 14 has a dielectric constant that typically exceeds 80. The dielectric film 14 thus has a dielectric constant that is considerably higher than for the dielectric substrate 10. In practice, this creates an assymetry in the design, where the design of the device at the substrate side will have almost a negligible influence on the impedance properties.

A metallic layer 16, 18 is printed onto a top surface 15 of the dielectric film 14, i.e. on the side opposite to the side being in contact with the conducting strip 12. The outer sides 23 and 24 of the metallic layer 16 and 18 are electrically grounded, i.e. the sides of the metallic layers 16, 18 facing outwards from the center of the device. The metallic layer 16, 18 has in this embodiment a central slot 17 substantially parallel with the transmission line 12, separating the metallic layer into two ground planes 16 and 18. The central slot 17 extends the whole way between the first end 20 and the second end 22. The central slot 17 is preferably symmetric with respect of the transmission line 12. The metallic layers 16, 18 are in such a case mirror images to each other. However, also asymmetric arrangements are feasible, e.g. having a metallic layer on only one side. The central slot 17 has preferably an average width exceeding the width of the transmission line 12. The characteristic impedance of the device undergoes a gradual change of value through a gradual variation of the slot 17 width along its length, i.e. between the first end 20 and the second end 22. With appropriate choices of parameters, an impedance of less than 5Ω is achievable at the low impedance end, i.e. the second end 22. In other words, the slot 17 has a tapered shape, or equivalent, the two ground planes 16 and 18 have tapered shapes.

Even if the present embodiment comprises a constant width conductive strip 12, the present invention should not be limited thereto. Other embodiments including a variation of the width of the central conductive strip along tie length of the impedance coupler are also possible, as well as embodiments additionally comprising other prior art means of altering the impedance.

Figure 2:
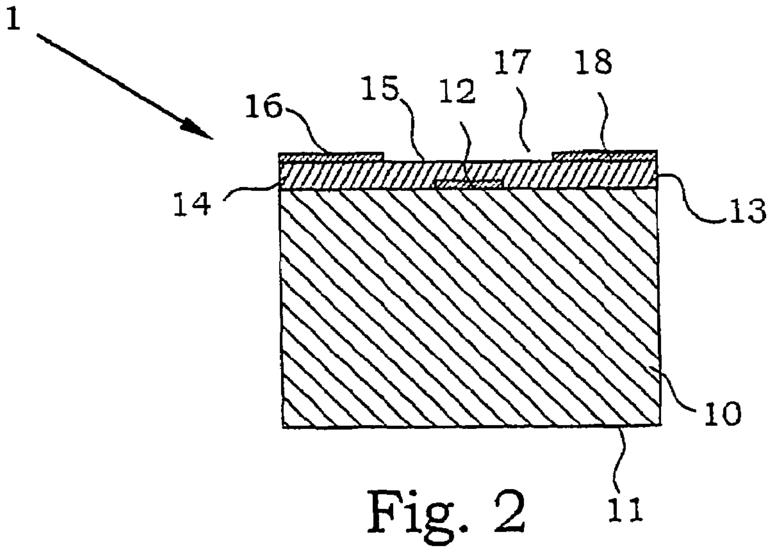
FIG. 2 is a cross-sectional view of the embodiment of FIG. 1.

FIG. 2 illustrates the embodiment of FIG. 1 in cross section.

In order to illustrate the advantages with the present invention, a first multi-layered configuration according to FIGS. 1 and 2 was analyzed and its performance was compared to different prior-art devices. The first test device simulated consisted of a deposited thin dielectric film 14 with $\epsilon_r$=140 and a thickness above the top of the transmission line of 1 μm. The transmission line 12 is printed on the substrate 10 with a width of 120 μm and a thickness of 2 μm. The substrate 10 is in this test device composed by alumina with a thickness of 635 μm and a dielectric constant of 9.8. The first test device is 1.6 cm long and the tapered slot 17 printed over the high-$\epsilon_r$ film varies from 300 μm at a first side to 118 μm at the other side, having a shape that results in a reflection coefficient of the Chebyshev type. The corresponding impedances for the device found in the numerical simulation using the commercial software High Frequency Structure Simulator HFFS are 50Ω for the first side and 3.5Ω for the second side.

Figure 4:
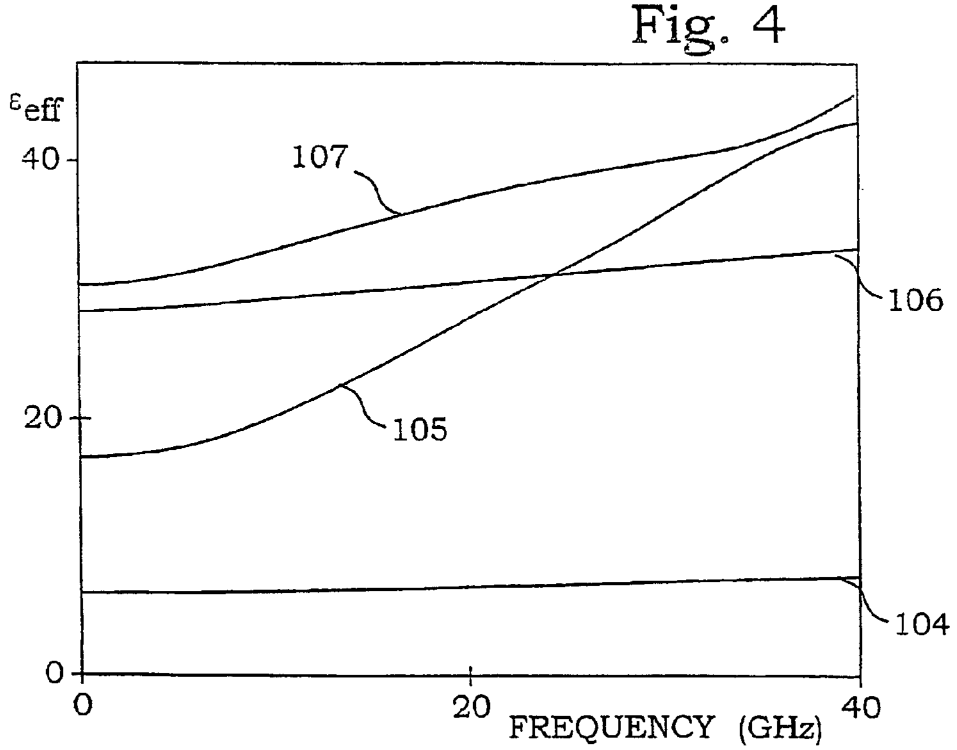
FIG. 4 is a diagram illustrating frequency dispersion of an embodiment of an impedance-matching coupler according to the present invention.

The behavior of this device was investigated theoretically and the results were compared to those obtained for prior-art devices. FIG. 4 presents frequency dispersion curves for the effective dielectric constant of the above described first test device. Curve 104 corresponds to the port at the first side, i.e. the 50Ω port, and curve 106 corresponds to the port at the second side, i.e. the low impedance end of the tapers. The multilayer configuration according to the present invention shows very little dispersion up to at least 40 GHz, which allows the propagation of very short pulses without substantial distortion. As comparison, curves 105, 107 representing the two ports of a transmission line impedance transformer according to U.S. Pat. No. 5,200,719 with a bulk substrate having $\epsilon_r$=80 is shown. It can there be observed that the dispersion is significant.

Figure 5:
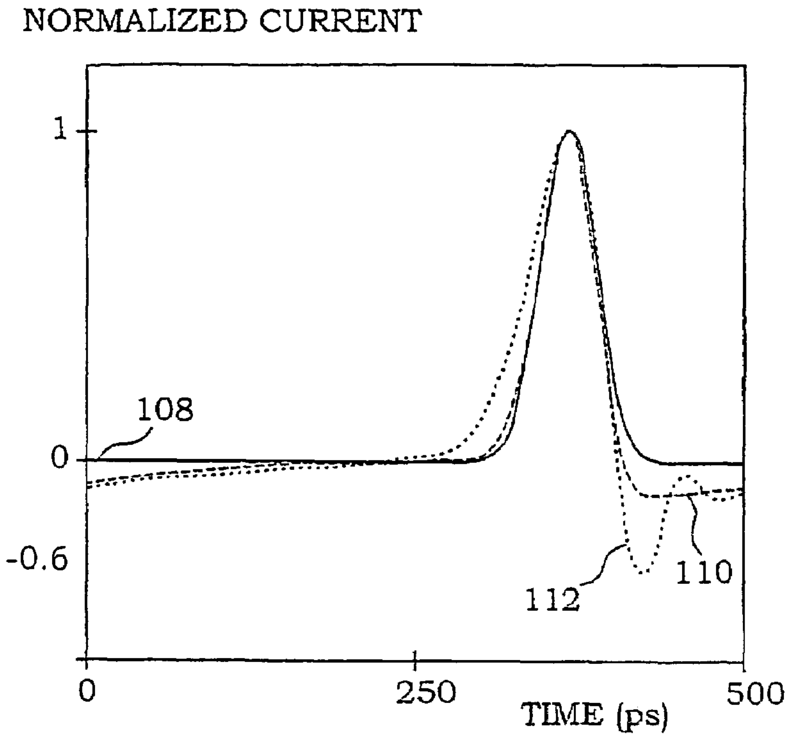
FIG. 5 is a diagram illustrating simulated output response of impedance-matching couplers to a gaussian input pulse.

In FIG. 5, the calculated response of the first test device to a short voltage pulse is illustrated. An input pulse 108 consisting of a 50 ps (full width half maximum) gaussian pulse is used. The simulated output of the considered tapers is presented as the broken curve 110. The response for the multi-layered first test device according to the present invention presents only minor distortions due to its large useful bandwidth. Even faster pulses than 50 ps can thus be used together with the present test device. As a comparison, the output response of the prior-art transmission line impedance transformer according to U.S. Pat. No. 5,200,719 mentioned above is depicted as a dotted curve 112. The ringing due to the dispersion is apparent, and the performance of the impedance matching coupler according to the present invention is much improved.

When considering the dispersion effects, bulk material will give large dispersion and films will give small dispersion. It is thus preferable to use a dielectric film 14 with a thickness of less than 100 μm as the dielectric layer. Manufacturing of thick films (5-100 μm) and thin films (less than 5 μm) of high dielectric constant materials is possible with thick film techniques and thin film techniques, respectively, according to recent progresses, see e.g. Spartak S. Gevorgian and Erik Ludvig Kollberg, “Do We Really Need Ferroelectrics in Paraelectric Phase Only in Electrically Controlled Microwave Devices?”, IEEE Transactions on Microwave Theory and Techniques, Vol. 49, No. 11, November 2001 and references therein. When only considering dispersion behavior, an as thin film as possible seems to be an optimum choice for ensuring low dispersion. However, as described further below, accuracy considerations at manufacturing point in another direction.

Figure 3:
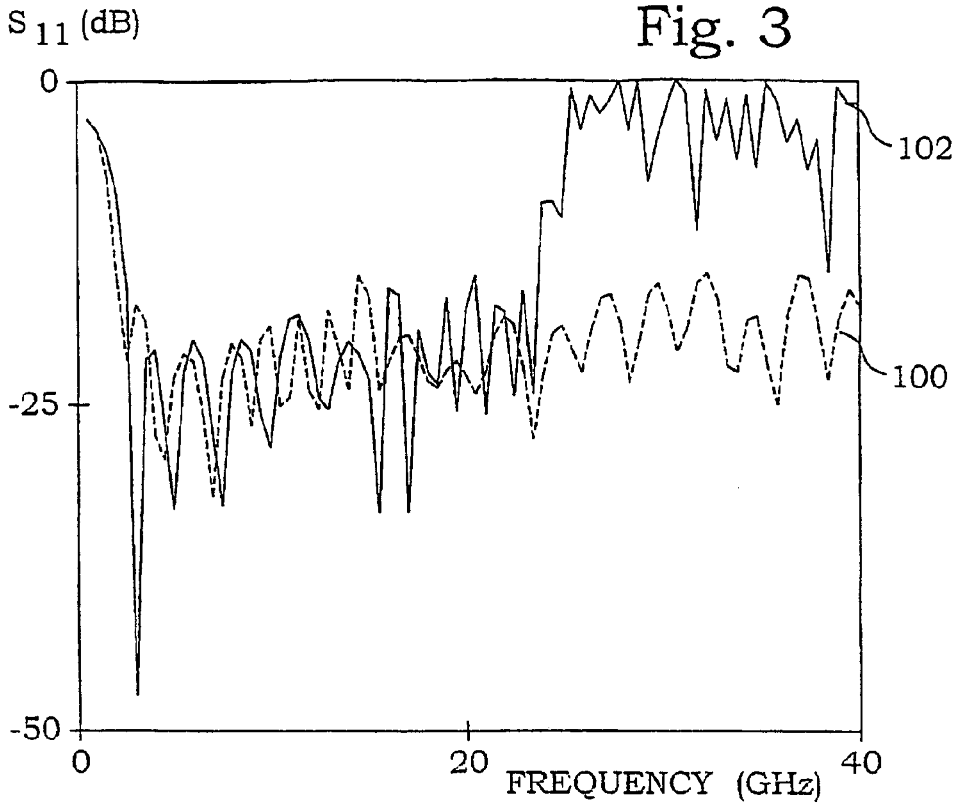
FIG. 3 is a diagram illustrating input return losses in impedance-matching couplers.

FIG. 3 illustrates a curve 100 representing the estimated input return loss of the test device according to the present invention. It can be seen that over the entire investigated frequency range of 40 GHz, the return loss was in the order of magnitude of −20 dB. The response does not deteriorate significantly with frequency in the investigated range. As comparison, a curve 102 representing a transmission line impedance transformer according to U.S. Pat. No. 5,200,719 with a bulk substrate having $\epsilon_r$=80 is shown. It can there be observed that the structure does not respond above 25 GHz, due to appearance of higher order modes.

The appearance of higher modes thus constitutes a severe threat to the useful frequency range. When considering the test device used in the discussion above, using an extremely thin dielectric film, it is possible to realize that the advantageous behavior of the device depends strongly on the accuracy of the geometrical size and positioning of the conducting strip 12 in relation to the ground planes 16, 18. When the slot between the ground planes 16, 18 is large compared with the width of the conducting strip 12, small errors in positioning does not give any significant impedance changes. However, at the narrow slot side, i.e. close to end 22 (FIG. 1), the inner edges of the ground planes 16, 18 comes very close to the edges of the conducting strip 12. A very small misalignment or inaccuracy of the slot width will change the impedance at this end considerably. In order to be able to ensure a certain end impedance, the manufacturing has to be performed extremely careful. However, manufacturing at this level of accuracy is extremely difficult and expensive.

Such manufacturing considerations therefore call for the use of slightly thicker films. The use of thick films (5-100 μm) is thus to prefer, and thick films in the range of 10-70 μm are particularly advantageous. The influence of such a larger thickness than in the above investigated test device is believed not to change the dispersion behavior considerably, and the expected properties of a device using a film thickness of 10-70 μm are quite well represented by the curves of the diagrams in FIGS. 3, 4 and 5.

Figure 7:
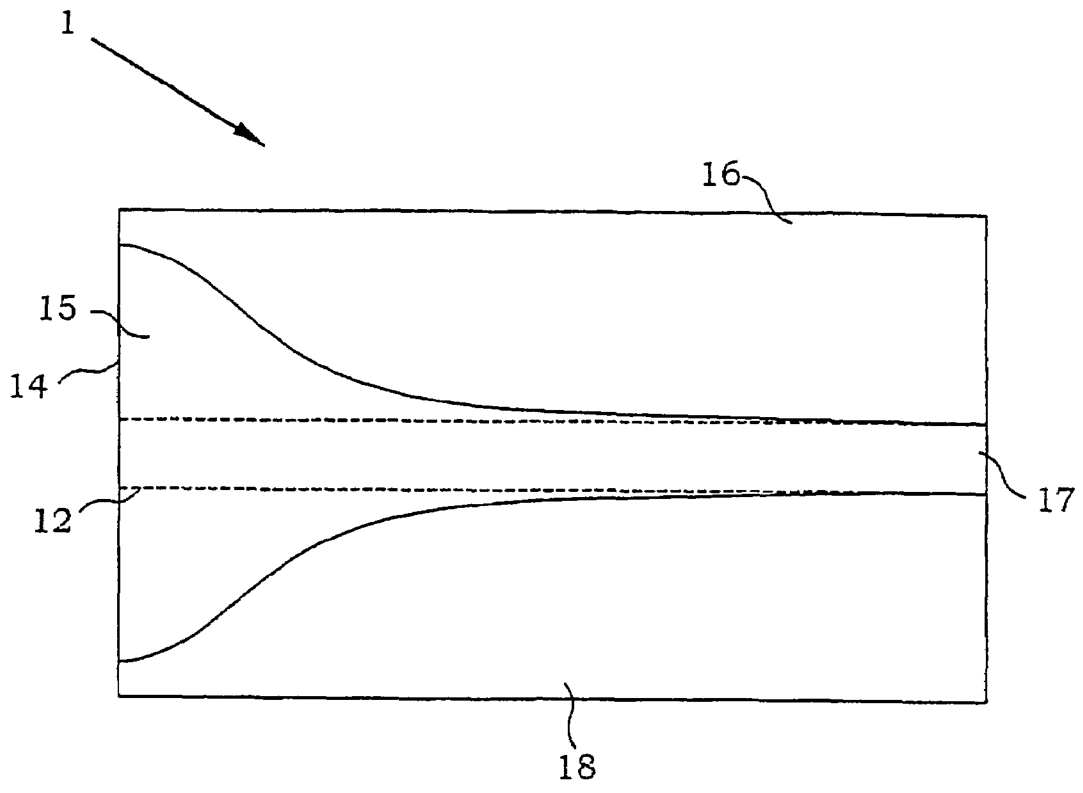
FIG. 7 is a top view of another embodiment of ground planes possible to be used with the present invention.

In FIG. 1 and FIG. 2, the tapering of the ground planes 16, 18 is illustrated as being linear. However, different embodiments having other geometrical shapes of the ground plane tapering are also possible, causing a reflection coefficient of the Bessel, Chebyshev or exponential types. For instance, the simulations illustrated in FIGS. 3-5 where based on devices having a Chebyshev type of tapering, which in this case gave somewhat better results than linear, Bessel or exponential types. Such an example of a non-linear tapering is for instance shown in FIG. 7. Here the gradual change of the central slot is generally slower at the narrow end. Furthermore, the ground plane edges are parallel to the conducting strip at both ends. Such a configuration may serve to make the gradual impedance change from one side of the device to the other softer and more even.

The present invention present a number of advantages compared with prior-art devices.

Thin and thick films can be deposited in various ways, as sol-gel processing, laser ablation, magnetron sputtering, chemical vapor deposition, aerosol, screen-printing or sintering-based techniques, and their relative dielectric constants can be very high. By using the present invention, the transmission lines have simple cross-sections and very comfortable transversal dimensions, which leads to less expensive manufacturing. The multi-layered structure according to the present invention present a large bandwidth and a low dispersion. Simulations have shown that it is possible to reach values as low as 3.5Ω on the low-impedance end of the taper with a 120 μm constant strip width, which is compatible with dimensions of commercial radio frequency connectors. Investigation of input return loss in devices according to the present invention have shown single mode operation to almost 50 GHz and very little dispersion, which allows the propagation of very short pulses without substantial distortion.

With certain choices of substrates, dielectric layer material and film deposition techniques, there might be minor problems to achieve a sufficient adhesion between the substrate and the dielectric layer. One possible way to reduce such adhesion problems is to deposit an extremely thin layer of a bridge material. The bridge material should typically be one monolayer thick, and may e.g. comprise a metal such as titanium, indium or chrome. The bridge layer is deposited directly on the substrate prior to the deposition of the dielectric material. The chemical binding of the deposited ferroelectric ceramic to the monolayer metal bridge layer, which in turn is bound to the substrate, enables increased adherence. A monolayer of metal is not electrically conductive and would not significantly affect the performance of the impedance matching device.

Figure 6:
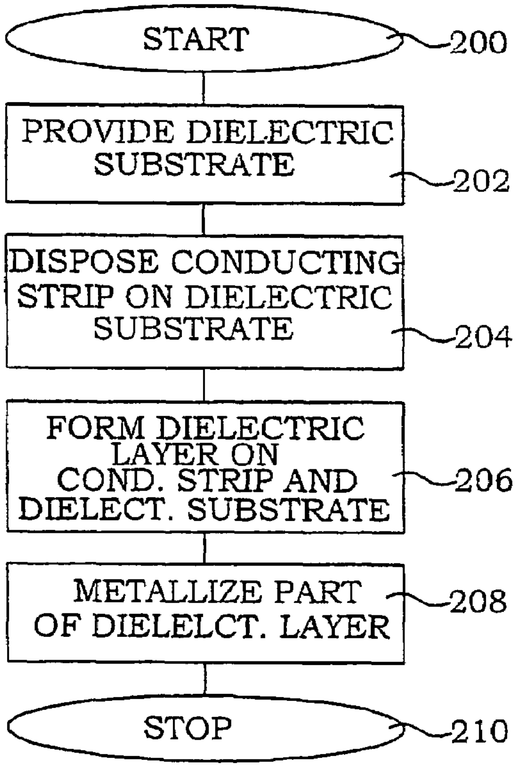
FIG. 6 is a flow diagram illustrating an embodiment of a manufacturing method according to the present invention.

The use of high dielectric constant materials in this type of multi-layered structures is enabled by use of film-depositing techniques. By forming the different dielectric layer components onto an original substrate, adhesion problems do not arise in the same extent as for prior-art multi-layer solutions. FIG. 6 illustrates an embodiment of a manufacturing method of impedance-matching devices according to the present invention. The procedure starts in step 200. In step 202, a dielectric substrate is provided as the original substrate onto which the multi-layer is to be built. A conducting strip is in step 204 disposed on the first dielectric layer, forming the transmission line. This disposing is preferably performed as a printing, according to well-known prior-art printing techniques, of a metal film having the required geometrical extension. In step 206, a dielectric layer having a very high dielectric constant is formed over the conducting strip. This leads to that the conducting strip becomes encircled by the two dielectric entities, the dielectric substrate and the dielectric layer. The dielectric layer is preferably a thick film and the deposition is preferably performed by thick-film techniques. The formation of the second dielectric layer directly on top of the conducting strip and first dielectric layer provides for good adhesion properties. In one embodiment, the formation of the dielectric layer comprises depositing of dielectric substances mixed with organic solvents over the conducting strip and at least a part of the dielectric substrate, followed by a heat treatment. During the heating, any organic solvent components are removed and the remaining dielectric substances forms the dielectric layer. Finally, in step 208, a part of the dielectric layer is metallized, forming tapered ground planes. This is preferably performed by printing metal films The procedure is ended in step 210.

It will be understood by those skilled in the art that various modifications and changes may be made to the present invention without departure from the scope thereof, which is defined by the appended claims.

The invention claimed is:

1. Impedance-matching device, comprising:

a dielectric substrate;

a dielectric layer covering at least a part of a first surface of said dielectric substrate;

a conducting strip provided between said dielectric substrate and said dielectric layer;

a metallic layer provided on a surface of said dielectric layer being directed away from said conducting strip, wherein said dielectric layer has a substantially higher dielectric constant than a dielectric constant of said dielectric substrate; and said dielectric layer being a dielectric film, having a thickness below 100 μm.

2. Impedance-matching device according to claim 1, wherein said dielectric layer has a dielectric constant that is at least eight times larger than the dielectric constant for said dielectric substrate.

3. Impedance-matching device according to claim 1, wherein said dielectric film is a thick film, having a thickness between 5 and 100 μm.

4. Impedance-matching device according to claim 3, wherein said dielectric film is a thick film, having a thickness between 10 and 70 μm.

5. Impedance-matching device according to claim 1, wherein said dielectric substrate has a thickness that is at least ten times larger than the thickness of said dielectric layer.

6. Impedance-matching device according to claim 1, wherein said conducting strip has a substantially constant width.

7. Impedance-matching device according to claim 6, wherein said conducting strip has a width in the order of magnitude of 120 μm.

8. Impedance-matching device according to claim 6, wherein said dielectric layer has a thickness that is thicker than 10% of said width of said conducting strip.

9. Impedance-matching device according to claim 1, wherein said metallic layer having a central slot substantially parallel to said conducting strip.

10. Impedance-matching device according to claim 9, wherein said central slot having a tapered shape.

11. Impedance-matching device according to claim 1, wherein said tapered shape gives a reflection coefficient characteristic of a type selected from the group of:

linear,

Bessel type,

Chebyshev type, and exponential.

12. Impedance-matching device according to claim 11, wherein said tapered shape gives a reflection coefficient characteristic of a Chebyshev type.

13. Impedance-matching device according to claim 1, wherein an intermediate extreme thin film disposed between said dielectric substrate and said dielectric layer, said intermediate extreme thin film being a metal film in the monolayer range enhancing adhesion of said dielectric layer.

14. Impedance-matching device according to claim 13, wherein said intermediate film comprises substances selected from the group of: titanium, indium or chrome.

15. Method for manufacturing of impedance-matching device, comprising:

providing a dielectric substrate; and disposing a conducting strip on said dielectric substrate:

forming a dielectric layer over said conducting strip and at least a part of said dielectric substrate, whereby said conducting strip being encircled by said dielectric layer and said dielectric substrate;

said dielectric layer being a dielectric film, having a thickness below 100 μm;

said dielectric layer having a substantially higher dielectric constant than a dielectric constant of said dielectric substrate; and metallizing at least a part of said dielectric layer.

16. Method according to claim 15, wherein said forming step comprises a film creating technique selected from the group of:

sol-gel processing, laser ablation, magnetron sputtering, chemical vapor deposition, aerosol, screen-printing, and sintering-based techniques.

17. Method according to claim 15, further comprising depositing an intermediate extreme thin film onto said dielectric substrate before performing said step of forming a dielectric layer, said intermediate extreme thin film being a metal film in the monolayer range enhancing adhesion of said dielectric layer.

* * * * *